United States Patent
Kubota

(10) Patent No.: US 9,545,031 B2
(45) Date of Patent: Jan. 10, 2017

(54) HEAT RECEIVING APPARATUS, COOLING APPARATUS, AND ELECTRONIC APPARATUS

(71) Applicant: FUJITSU LIMITED, Kawasaki-shi, Kanagawa (JP)

(72) Inventor: Jumpei Kubota, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 39 days.

(21) Appl. No.: 14/600,517

(22) Filed: Jan. 20, 2015

(65) Prior Publication Data

US 2015/0138730 A1 May 21, 2015

Related U.S. Application Data

(63) Continuation of application No. PCT/JP2012/070348, filed on Aug. 9, 2012.

(51) Int. Cl.

| | |
|---|---|
| *H01L 23/473* | (2006.01) |
| *H05K 7/20* | (2006.01) |
| *G06F 1/20* | (2006.01) |
| *H01L 23/34* | (2006.01) |
| *F28F 27/02* | (2006.01) |
| *F28D 15/00* | (2006.01) |

(52) U.S. Cl.
CPC .......... *H05K 7/20254* (2013.01); *F28D 15/00* (2013.01); *F28F 27/02* (2013.01); *G06F 1/20* (2013.01); *H01L 23/34* (2013.01); *H01L 23/473* (2013.01); *H05K 7/20272* (2013.01); *H05K 7/20281* (2013.01); *H05K 7/20772* (2013.01); *H05K 7/20836* (2013.01); *H01L 2924/0002* (2013.01)

(58) Field of Classification Search
CPC ........... H05K 7/20209; H05K 7/20281; H01L 23/473; H01L 23/4735
See application file for complete search history.

(56) References Cited

U.S. PATENT DOCUMENTS

| | | | | |
|---|---|---|---|---|
| 6,452,798 | B1 * | 9/2002 | Smith | H01L 23/345 165/80.4 |
| 7,104,312 | B2 * | 9/2006 | Goodson | F04B 19/006 165/104.33 |

(Continued)

FOREIGN PATENT DOCUMENTS

| | | |
|---|---|---|
| JP | 61-218146 | 9/1986 |
| JP | 4-152659 | 5/1992 |

(Continued)

OTHER PUBLICATIONS

English Machine Translation of Suzuki, Japanese Publication No. JP 2007-258624 A, dated Oct. 4, 2007, translated on Jul. 16, 2016.*

(Continued)

*Primary Examiner* — Robert J Hoffberg
(74) *Attorney, Agent, or Firm* — Staas & Halsey LLP

(57) ABSTRACT

A heat receiving apparatus includes a heat receiver including: a case that is provided at its inside with a flow path through which a refrigerant flows, and that conducts heat from a heat-generating part arranged outside the case; and a valve that is capable of changing a cross sectional area of a part of the flow path in a state where the refrigerant flows through the flow path.

6 Claims, 8 Drawing Sheets

(56) References Cited

U.S. PATENT DOCUMENTS

| | | | |
|---|---|---|---|
| 7,233,493 B2 * | 6/2007 | Wang | H05K 7/20209 313/33 |
| 7,420,807 B2 * | 9/2008 | Mikubo | G06F 1/20 165/104.26 |
| 7,438,124 B2 * | 10/2008 | Bhatti | H05K 7/20736 165/122 |
| 7,450,381 B2 * | 11/2008 | Gilliland | H05K 7/20154 165/287 |
| 7,778,029 B2 * | 8/2010 | Ueno | G11B 33/142 165/80.3 |
| 8,416,573 B2 * | 4/2013 | Hamano | F16L 55/00 165/104.33 |
| 8,488,313 B2 * | 7/2013 | Lin | H05K 7/20836 361/679.49 |
| 8,493,735 B2 * | 7/2013 | Iijima | G06F 1/20 361/679.53 |
| 9,338,923 B2 * | 5/2016 | Lee | G03B 21/16 |
| 2005/0231914 A1 | 10/2005 | Mikubo et al. | |
| 2011/0110043 A1 * | 5/2011 | Iijima | G06F 1/20 361/701 |
| 2013/0242504 A1 * | 9/2013 | Cartes | G05D 23/1931 361/679.49 |

FOREIGN PATENT DOCUMENTS

| | | |
|---|---|---|
| JP | 2000-277962 | 10/2000 |
| JP | 2004-134742 | 4/2004 |
| JP | 2007-258624 | 10/2007 |
| JP | 2011-66199 | 3/2011 |
| JP | 2012-28720 | 2/2012 |

OTHER PUBLICATIONS

International Search Report mailed Sep. 25, 2012, in corresponding International Patent Application No. PCT/JP2012/070348.

Written Opinion of the International Search Authority mailed Sep. 25, 2012, in corresponding International Patent Application No. PCT/JP2012/070348.

* cited by examiner

HEAT RECEIVING APPARATUS, COOLING APPARATUS, AND ELECTRONIC APPARATUS

CROSS-REFERENCE TO RELATED APPLICATIONS

This application is a continuation application of PCT/JP2012/070348 filed on Aug. 9, 2012 and designated the U.S., the entire contents of which are incorporated herein by reference.

FIELD

The embodiments discussed herein are related to a heat receiving apparatus, a cooling apparatus, and an electronic apparatus.

BACKGROUND

It is known that a heat receiver which receives heat from a heat-generating part or the like and cools the heat-generating part or the like mounted on a printed circuit board installed in an electronic apparatus. A flow path through which a refrigerant flows is formed within the heat receiver. To improve the heat-receiving efficiency of the heat receiver, it is conceivable to increase a flow velocity of the refrigerant. For example, the flow path is designed so as to reduce a cross sectional area of a part of the flow path corresponding to a high temperature region of the heat-generating part, which increases the flow velocity of the refrigerant in the part, partially improving the heat-receiving efficiency. A technique related to such a heat receiver is disclosed in Japanese Patent Application Publication Nos. 2004-134742, and 2012-28720.

Temperature distribution of the heat-generating part is changed in accordance with elapsed operating time of the heat-generating part or an operating condition thereof. For example, in some cases, the temperature of the whole heat-generating part is low, or the temperature of a part thereof is high. When the temperature of the whole heat-generating part is low, it is preferable that the cross sectional area of the flow path is large to some extent in order to reduce pressure loss. In contrast, when the temperature of a part of the heat-generating part is high, it is preferable that the cross sectional area of a part of the flow path corresponding to a high temperature region of the heat-generating part is small to some extent in order to improve the heat-receiving efficiency of receiving heat from the heat-generating part. However, a conventional heat receiver is not capable of changing the cross sectional area of the flow path on the basis of temporal change in the temperature distribution of the heat-generating part.

SUMMARY

According to an aspect of the embodiments, a heat receiving apparatus includes a heat receiver including: a case that is provided at its inside with a flow path through which a refrigerant flows, and that conducts heat from a heat-generating part arranged outside the case; and a valve that is capable of changing a cross sectional area of a part of the flow path in a state where the refrigerant flows through the flow path.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
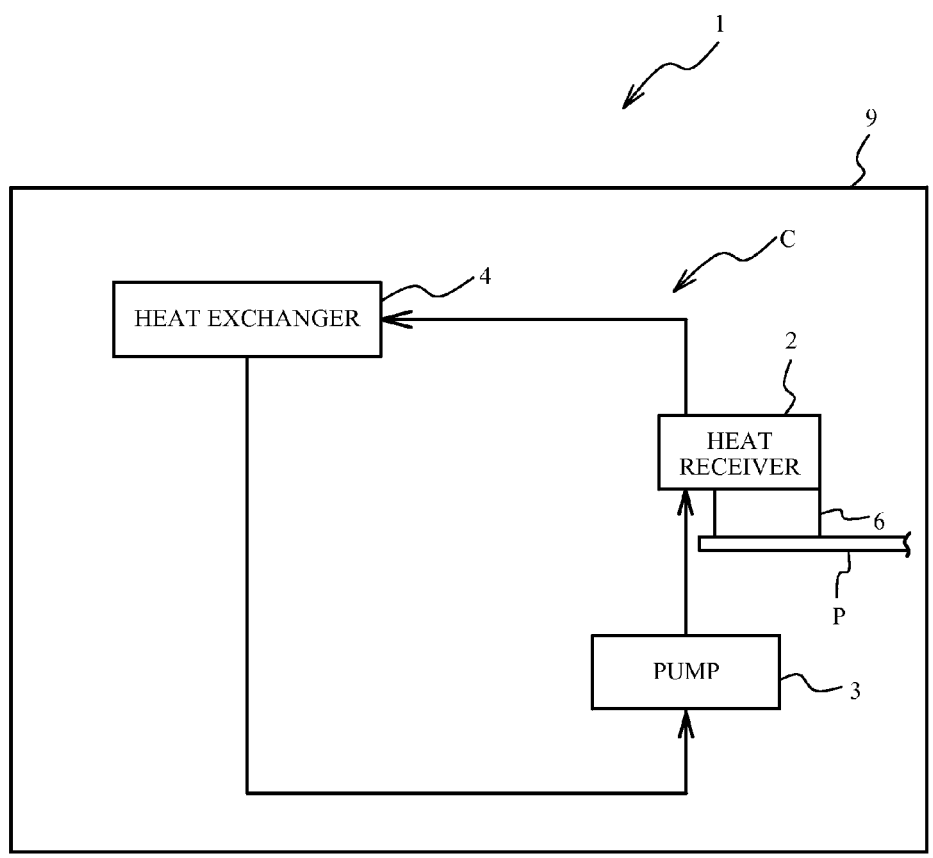
FIG. 1 is a block diagram of an electronic apparatus.

FIG. 1 is a block diagram of an electronic apparatus 1. The electronic apparatus 1 is an information processing apparatus such as a super computer, a server, a network apparatus, a desktop computer, or a notebook computer. The electronic apparatus 1 includes a cooling apparatus C for cooling a heat-generating part 6, and a housing 9 housing the cooling apparatus C. The heat-generating part 6 is, for example, an electronic part such as a CPU or an LSI. The heat-generating part 6 may be plural electronic parts arranged within a single package, or may be single semiconductor chip. The heat-generating part may be any one of parts that generates heat by electric power. The heat-generating part 6 is mounted on the printed circuit board P.

The cooling apparatus C includes a heat receiver 2, a pump 3, and a heat exchanger 4. A refrigerant circulates through the cooling system C. The heat receiver 2 is provided in contact with the heat-generating part 6, and transfers heat from the heat-generating part 6 to the refrigerant. The pump 3 causes the refrigerant to circulate. The heat exchanger 4 dissipates heat from the refrigerant to the outside. The heat exchanger 4 may be any one of air-cooled type or a water-cooled type. In a case where the heat exchanger 4 is the air-cooled type, a fan may be provided for cooling the heat exchanger 4. The apparatuses are connected through pipes made of metal and through flexible hoses. The refrigerant is, for example, antifreeze of propylene glycol, but the refrigerant is not limited thereto. The cooling apparatus C includes a heat receiving apparatus L to be described later.

Figure 2:
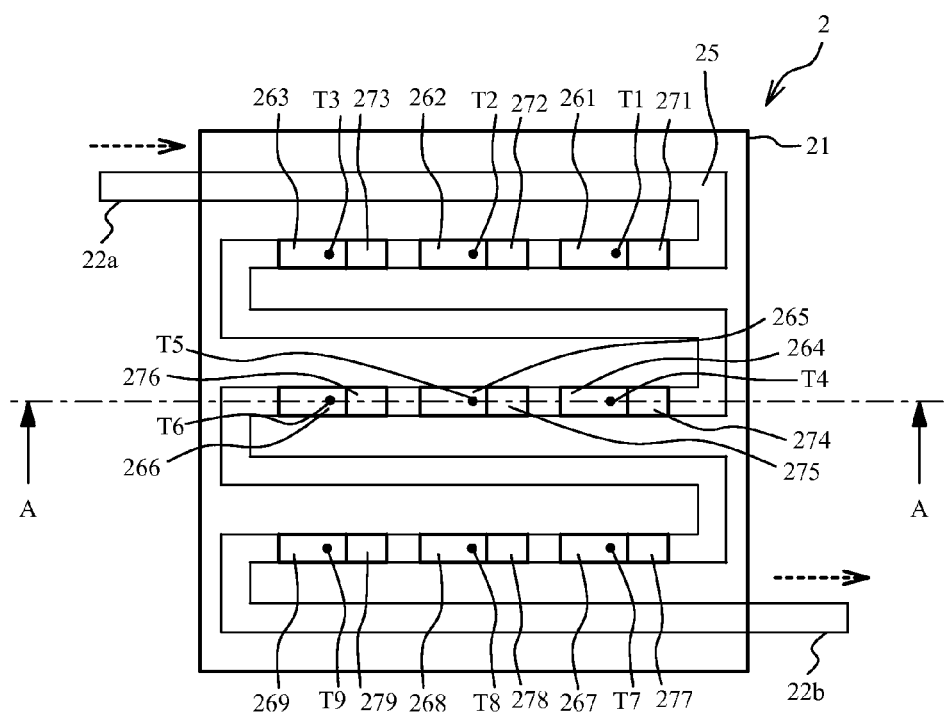
FIG. 2 is an explanatory view of a heat receiver.

FIG. 2 is an explanatory view of the heat receiver 2. The heat receiver 2 is included in the heat receiving apparatus L. The heat receiver 2 includes a case 21 made of such as copper or aluminum. The case 21 is an example of a case that is provided at its inside with a flow path 25 through which the refrigerant flows, and that conducts heat from the heat-generating part 6 arranged outside the case 21. The flow path 25 has a meandering shape as illustrated in FIG. 2, but the flow path 25 is not limited to this shape. Nozzles 22a and 22b project outside from the case 21. The nozzles 22a and 22b are connected to the flow path 25 within the case 21. An end of a tube is connected to the nozzle 22a and the other end of the tube is connected to the pump 3 side. An end of a tube is connected to the nozzle 22b and the other end of the tube is connected to the heat exchanger 4 side.

Within the flow path 25, partition walls 261 to 269 are provided in the order from the upstream side to the downstream side, and electromagnetic valves 271 to 279 are provided in the order from the upstream side to the downstream side. That is, the partition walls 261 to 269 and the electromagnetic valves 271 to 279 are arranged in different positions, respectively, in such a direction that the refrigerant flows. The opened states and the closed states of the electromagnetic valves 271 to 279 are controlled by a control circuit U that will be described later. Each of the electromagnetic valves 271 to 279 is an electrically operated valve by a motor. Each of the electromagnetic valves 271 to 279 is an example of a valve that is capable of changing a cross sectional area of a part of the flow path 25 in a state where the refrigerant flows through the flow path 25. Further, in the outside of the case 21, temperature sensors T1 to T9 are provided along the flow path 25 in the order from the upstream side to the downstream side.

Figure 3:
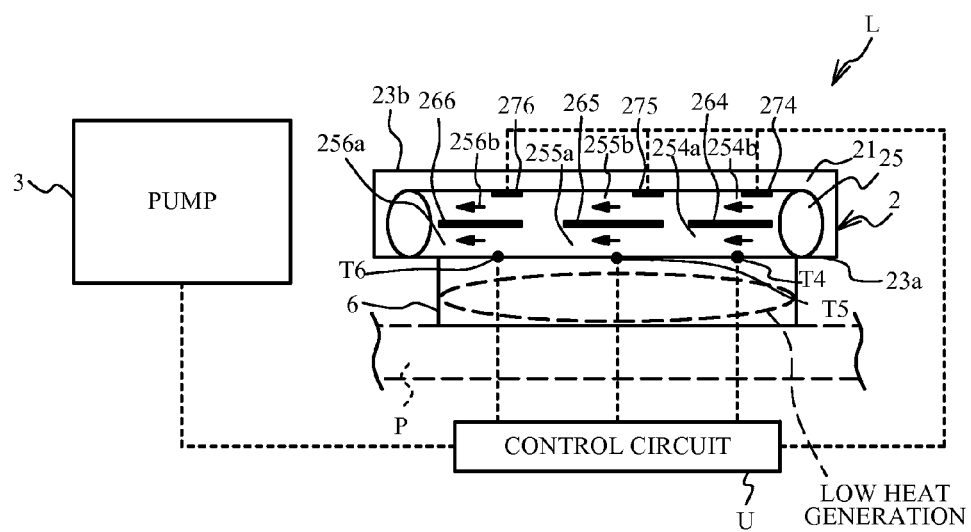
FIG. 3 is a sectional view taken along line A-A of FIG. 2.

FIG. 3 is a cross section taken along line A-A of FIG. 2. FIG. 3 illustrates the control circuit U and the pump 3. The control circuit U is included in the heat receiving apparatus L. A heat-receiving wall 23a of the case 21 faces and contacts with the heat-generating part 6. The heat-receiving wall 23a is an example of a first wall. A wall 23b is an example of a second wall. The partition wall 264 has a certain length in such a direction that the refrigerant flows. The partition wall 264 is provided to partition the flow path 25, through which the refrigerant flows, into the heat-receiving wall 23a side and the wall 23b side. The partition wall 264 partitions the flow path into a region 254a at the heat-receiving wall 23a side and a region 254b at the wall 23b side. The other partition walls have the same structure. Thus, the regions 254a to 256a are examples of first regions. The regions 254b to 256b are examples of second regions. Additionally, the adjacent partition walls 264 and 265 are separated from each other, and the adjacent partition walls 265 and 266 are separated from each other.

The electromagnetic valve 274 is provided at the wall 23b side within the flow path 25. The electromagnetic valve 274 includes: a shaft secured to the wall 23b side; and a board capable of swinging about the shaft in a predetermined range. The other electromagnetic valves have the same structure.

The temperature sensors T1 to T9 are provided at the outside of the heat-receiving wall 23a of the case 21, and are sandwiched between the heat-generating part 6 and the heat receiver 2. In addition, FIG. 3 simply illustrates the temperature sensors T4 to T6. For example, recess portions capable of housing the respective temperature sensors T4 to T6 are provided on the outside of the heat-receiving wall 23a. The temperature sensors T4 to T6 partially exposed from the respective recess portions detect the temperature of the heat-generating part 6. The other temperature sensors have the same structure. The temperature sensors T1 to T9 are in contact with the heat-generating part 6 and detect the temperature thereof. In addition, as illustrated in FIG. 2, the temperature sensors T1 to T9 are located just under the flow path 25 on the heat-receiving wall 23a, but are not limited to these arrangements. For example, a temperature sensor may be provided between adjacent parts of the flow path 25, that is, may be provided at a part having no flow path. The temperature sensors T1 to T9 each detects the temperature of the part of the heat-generating part 6. The temperature sensors T1 to T9 are, for example, thermistors, but are not limited thereto.

The control circuit U controls the electromagnetic valves 271 to 279 to be in the opened states or the closed states on the basis of the respective output values from the temperature sensors T1 to T9. That is, the temperature sensors T1 to T9 are respectively associated with the electromagnetic valves 271 to 279. Specifically, the electromagnetic valve 271 is associated with the temperature sensor T1 closest to the electromagnetic valve 271 among the temperature sensors T1 to T9. Likewise, the electromagnetic valve 272 is associated with the temperature sensor T2 closest to the electromagnetic valve 272 among the temperature sensors T1 to T9. These arrangements are applicable to the other electromagnetic valves and the other temperature sensors. In addition, the electromagnetic valves 271 to 279 each has a sensor, signals of which are changed depending on the opened state or the closed state. The control circuit U can recognize each state of the electromagnetic valves 271 to 279. The control circuit U includes, for example, a ROM, a RAM, and a CPU. Also, the control circuit U may be mounted on the printed circuit board P on which the heat-generating part 6 is mounted, or may be mounted on another printed circuit board.

For example, as illustrated in FIG. 3, when the whole heat-generating part 6 has a comparatively low temperature, each output value of the temperature sensors T4 to T6 is less than a predetermined threshold value. For this reason, the control circuit U brings the electromagnetic valves 274 to 276 into the opened states. This permits the refrigerant to flow through the whole of the regions 254a to 256a and 254b to 256b. Therefore, the cross sectional area of the flow path 25 is ensured. Further, the pressure loss of the refrigerant flowing through the flow path 25 can be suppressed.

Figure 4:
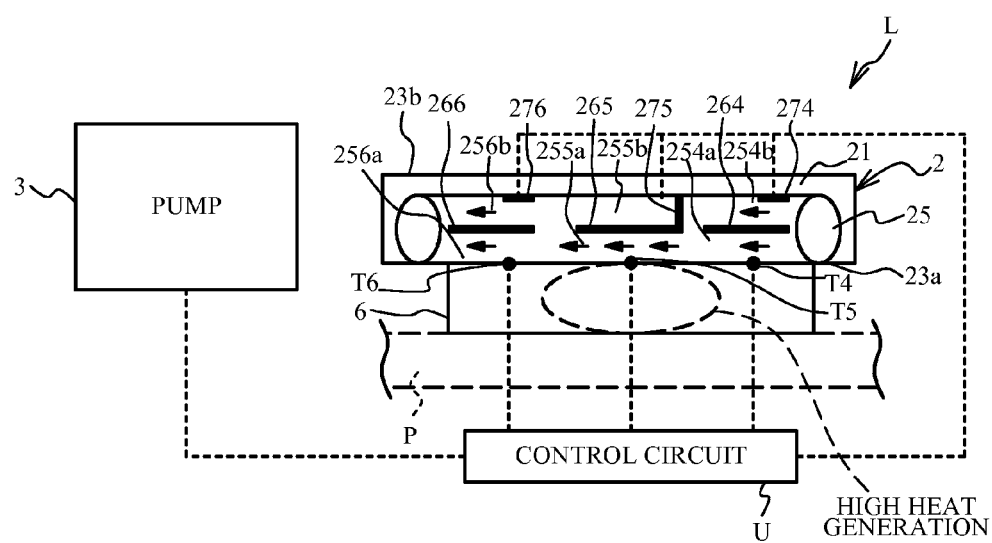
FIG. 4 is an explanatory view of a case of reducing a cross sectional area of a part of a flow path.

FIG. 4 is an explanatory view of a case of reducing a cross sectional area of a part of the flow path 25. FIG. 4 illustrates an example of a case where the center of the heat-generating part 6 has a high temperature. When only the center of the heat-generating part 6 has a high temperature and only the output value of the temperature sensor T5 is equal to or more than a predetermined threshold value, the control circuit U brings only the electromagnetic valve 275 into the closed state and maintains the opened states of the other electromagnetic valves. In the closed state of the electromagnetic valve 275, its end comes into contact with the partition wall 265. Therefore, the cross sectional area of the region 255b is reduced and the flow of the refrigerant through the region 255b is restricted. On the contrary, the refrigerant flows through the region 255a. In this way, in the closed state of the electromagnetic valve 275, the cross sectional area of the region 255b within the flow path 25 is reduced. Thus, the cross sectional area of the flow path 25 in the vicinity of the partition wall 265 is reduced. Accordingly, the flow velocity of the refrigerant flowing only through the region 255a is higher than that of the refrigerant flowing through both regions 255a and 255b. This improves the heat-receiving efficiency of the heat receiver 2 in the vicinity of the part where the flow velocity of the refrigerant is increased. In other words, the increases in the flow velocity of the refrigerant improves the heat-receiving efficiency of the heat receiver 2 in the vicinity of the part. Also, since the electromagnetic valves except for the electromagnetic valve 275 are in the opened states, the cross sectional area of the flow path 25 is ensured. Thus, the heat-receiving efficiency of the heat receiver 2 is partially improved, and the pressure loss of the refrigerant is suppressed.

Figure 5:
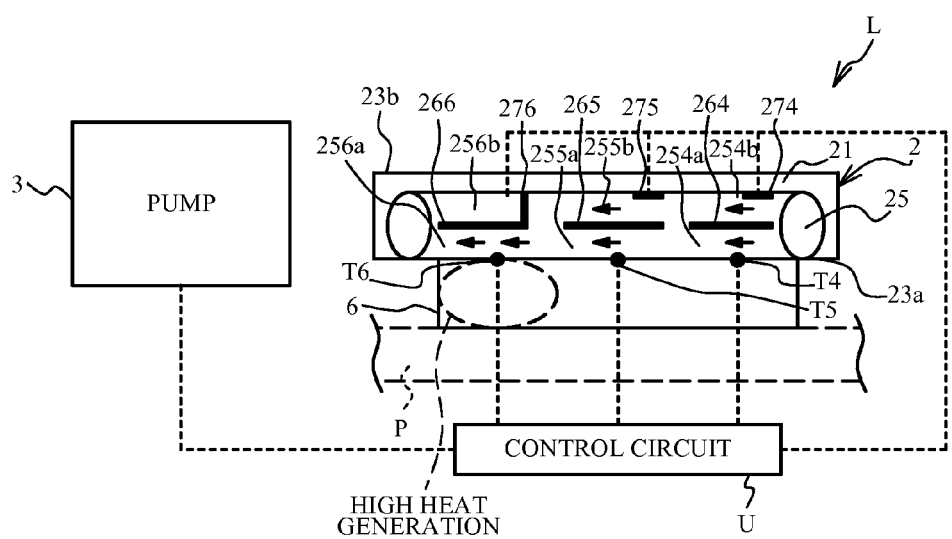
FIG. 5 is an explanatory view of a case of reducing a cross sectional area of a part of the flow path.

FIG. 5 is an explanatory view of a case of reducing a cross sectional area of a part of the flow path 25. FIG. 5 illustrates an example of a case where an end of the heat-generating part 6 has a high temperature. When only the output value of the temperature sensor T6 is equal to or more than a predetermined threshold valve, the control circuit U brings only the electromagnetic valve 276 into the closed state and maintains the opened states of the other electromagnetic valves. Since the electromagnetic valve 276 is brought into the closed state, the cross sectional area of the region 256*b* is reduced, so the flow of the refrigerant through the region 256*b* is restricted. In contrast, the refrigerant flows through the region 256*a*. When the electromagnetic valve 276 is in the closed state in such a way, the cross sectional area of the region 256*b* within the flow path 25 is reduced. Accordingly, the flow velocity of the refrigerant flowing only through the region 256*a* is higher than that of the refrigerant flowing through both regions 256*a* and 256*b*. This improves the heat-receiving efficiency of the heat receiver 2 in the vicinity of the region 256*a*, and suppresses the pressure loss of the refrigerant. In addition, as will be described later in detail, the control circuit U controls the pump 3 depending on the number of the electromagnetic valves in the closed states.

Further, as not illustrated, when the whole heat-generating part 6 has a high temperature and each output value of the temperature sensors T2, T4 to T6, and T8 is equal to or more than a predetermined threshold value, the control circuit U brings the electromagnetic valves 272, 274 to 276, and 278 into the closed states and brings the other electromagnetic valves into the opened states. Furthermore, for example, when two parts of the heat-generating part 6 have a high temperature and each output value of the temperature sensors T3 and T9 is equal to or more than a predetermined threshold value, the control circuit U brings the electromagnetic valves 273 and 279 into the closed states and brings the other electromagnetic valves into the opened states. In this way, even when the refrigerant flows, the heat receiver 2 can change a position where the heat-receiving efficiency is improved.

Herein, the temperature distribution of the heat-generating part 6 changes in accordance with elapsed operating time of the heat-generating part, an operating condition thereof, or an operating load thereon. In the present embodiment, the heat receiver 2 can partially improve the heat-receiving efficiency in light of the temperature distribution of the heat-generating part 6 changing with elapsed time. It is therefore possible to effectively cool the heat-generating part 6. Further, in the present embodiment, the heat receiver 2 can ensure the cross sectional area of the flow path 25 in order to suppress the increase in the pressure loss of the refrigerant when the whole heat-generating part 6 has a low temperature. This ensures the suitable flow of the refrigerant.

Further, a position that tends to have a comparatively high temperature differs with a type of the heat-generating part. The common heat receiver 2 can be used for such a different type of the heat-generating part. Thus, a different heat receiver does not have to be prepared for each heat-generating part.

The single heat receiver 2 may cool plural heat-generating parts. In this case, the heat receiver 2 can also change a position where the heat-receiving efficiency is high, and can effectively receive heat in light of each temperature distribution of the heat-generating parts.

Figure 6:
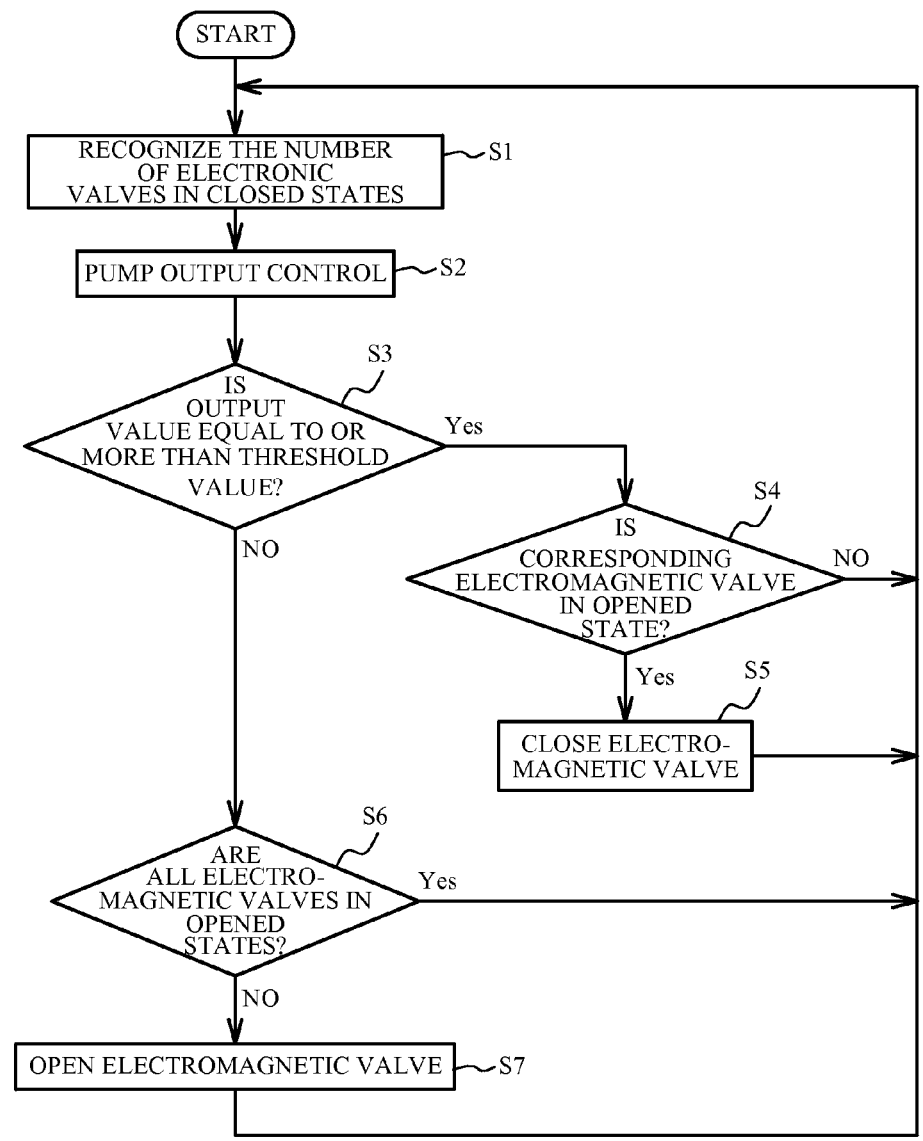
FIG. 6 is a flowchart of an example of the control performed by a control circuit.
Figure 7:
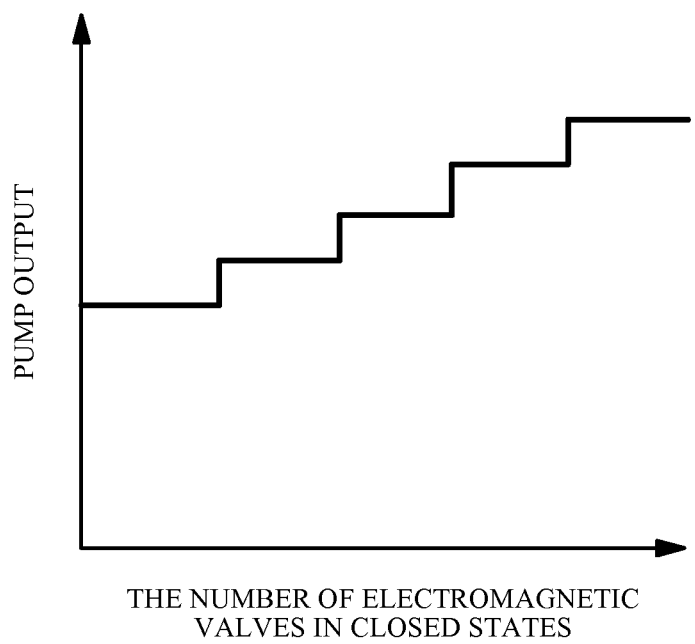
FIG. 7 is a map defining a relationship between the number of valves in closed states and output of a pump.

FIG. 6 is a flowchart of an example of the control performed by the control circuit U. The control circuit U recognizes the number of the closed states among the electromagnetic valves 271 to 279 (step S1). Next, the control circuit U controls output of the pump 3 (step S2). FIG. 7 is a map defining the relationship between the number of the electromagnetic valves in the closed states and the output of the pump 3. This map is stored beforehand in a memory or the like provided in the control circuit U. As illustrated in FIG. 7, the output of the pump 3 is controlled to increase as the number of the electromagnetic valves in the closed states increases. Herein, this means that the number of the positions of the reduced cross sectional area of the flow path 25 increases as the number of the electromagnetic valves in the closed states increases. For this reason, the pressure loss of the refrigerant flowing through the flow path 25 might increase as the number of the electromagnetic valves in the closed states increases. The control circuit U increases the output of the pump 3 in light of such an increase in the pressure loss of the refrigerant, which ensures the flow of the refrigerant within the flow path 25. Further, since the output of the pump 3 is reduced as the number of the electromagnetic valves in the closed states is reduced, the power consume of the pump 3 can be suppressed.

Next, the control circuit U determines whether or not each output value of the temperature sensors T1 to T9 is equal to or more than a predetermined threshold value (step S3). When an affirmative determination is made, the control circuit U determines whether or not the electromagnetic valve, corresponding to the temperature sensor the output value of which is equal to or more than a predetermined threshold valve, is in the opened state (step S4). When the corresponding electromagnetic valve is in the opened state, the control circuit U brings the electromagnetic valve into the closed state (step S5). When the corresponding electromagnetic valve has already been in the closed state, the control circuit U performs the processing of step S1 again.

When a negative determination is made in step S3, that is, when each output value of all the temperature sensors T1 to T9 is less than a predetermined threshold value, the control circuit U determines whether or not all the electromagnetic valves are in the opened states (step S6). When a negative determination is made, the control circuit U brings the electromagnetic valves from the closed states into the opened states (step S7). When an affirmative determination is made, the control circuit U performs the processing of step S1 again.

Figure 8:
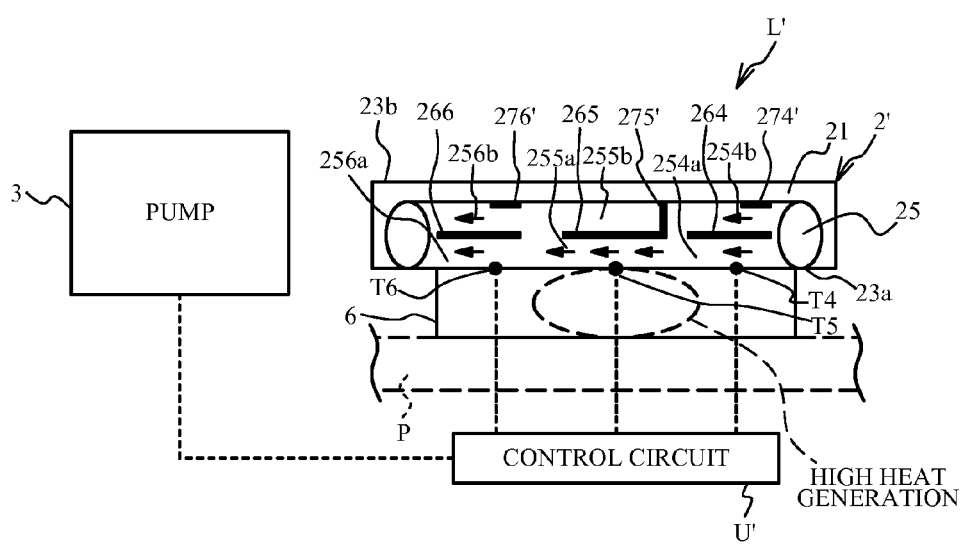
FIG. 8 is an explanatory view of a heat receiving apparatus according to a variation.

FIG. 8 is an explanatory view of a heat receiving apparatus L' according to a variation. A heat receiver 2' of the heat receiving apparatus L' is provided with regulating valves 274' to 276' different from the electromagnetic valves in drive system. At least part of each of the regulating valves 274' to 276' is made of a material such as bimetal the shape of which changes with the temperature of the refrigerant. This bimetal has a plate shape, rolls under low temperature environment, and extends under high temperature environment. For example, this regulating valve 274' includes: the bimetal having an end secured to the wall 23*b* side within the case 21; and a plate-shaped member secured to the other end of the bimetal. When the refrigerant has a low temperature, the bimetal rolls and the plate-shaped member is apart from the region 254*b*. When the refrigerant has a high temperature, the bimetal extends, and the plate-shaped member projects to the region 254*b* and reduces the cross sectional area thereof. Such a heat receiver 2' can effectively cool the heat-generating part 6. In addition, the control circuit U does not control the drive of the regulating valves 274' to 276', so these configurations are simple.

A threshold value used for controlling each of the plural electromagnetic valves may be different for each thereof. The opening degree of the electromagnetic valve may be gradually controlled. When the output value of the temperature sensor is more than a threshold value, the opening degree of the electromagnetic valve may be gradually controlled so that the cross sectional area is reduced as the difference between the output value and the threshold value increases.

Further, the number of the electromagnetic valves may not be identical to that of the temperature sensors. For example, in a case where the number of the electromagnetic valves is larger than that of the temperature sensors, the plural electromagnetic valves may be controlled depending on the output value of a single temperature sensor. Furthermore, in a case where the number of the electromagnetic valves is smaller than that of the temperature sensors, a single electromagnetic valve may be controlled depending on the output values of two or more adjacent temperature sensors among the plural temperature sensors.

The position where the temperature sensor is provided may be on the heat-receiving wall 23a side within the flow path 25. The temperature sensor may not be in direct contact with the heat-generating part. The heat receiver may not be in direct contact with the heat-generating part. For example, a metal member having good heat conductivity may intermediate between the heat receiver 2 and the heat-generating part 6.

The partition wall may not be provided within the flow path. That is, the flow velocity of the refrigerant flowing through the first region has only to be increased by reducing the cross sectional area of the second region only by a valve. The cross sectional areas of the first and second regions partitioned by the partition wall may not be identical to each other. That is, the partition wall may be arranged at a position other than the center of the cross section of the flow path.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A heat receiving apparatus, comprising:
    a single semiconductor package including a plurality of electronic parts;
    a heat receiver including:
    a case, a refrigerant flows through a flow path provided at an inside of the case, and the case conducts heat from the single semiconductor package arranged outside the case to the refrigerant flowing through the flow path;
    a first valve that changes a first cross sectional area of a first portion of the flow path that corresponds to a first one of the electronic parts of the single semiconductor package; and
    a second valve that changes a second cross sectional area of a second portion of the flow path that corresponds to a second one of the electronic parts of the single semiconductor package, the first and second portions of the flow path are serially arranged in different portions of the flow path;
    first and second temperature sensors that detect temperatures of the first and second ones of the electronic parts of the single semiconductor package, respectively, the first temperature sensor is arranged closer to the first valve than the second valve, and the second temperature sensor is arranged closer to the second valve that the first valve; and
    a control unit that controls the first valve to reduce the first cross sectional area of the first part of the flow path, when a first output value of the first temperature sensor is more than a first predetermined threshold value, and the control unit that controls the second valve to reduce the second cross sectional area of the second part of the flow path, when a second output value of the second temperature sensor is more than a second predetermined threshold value.

2. The heat receiving apparatus of claim 1, wherein the case includes:
    a first wall that faces the heat-generating part; and
    a second wall away from the heat-generating part and that faces the first wall, the flow path includes:
    a first region that is located adjacent to the first wall; and
    a second region that is located adjacent to the second wall,
        wherein the second region includes the first cross sectional area of the first portion of the flow path and the second cross sectional area of the second portion of the flow path,
    the first valve is capable of changing the first cross sectional area, and
    the second valve is capable of changing the second cross sectional area.

3. The heat receiving apparatus of claim 1, wherein the control unit increases an output of a pump that causes the refrigerant to flow through the flow path, when at least one of the first valve or second valve reduces a total cross section area of the first and second cross sectional areas.

4. The heat receiving apparatus of claim 3, wherein each of the first and second valves is an electrically operated type.

5. The heat receiving apparatus of claim 1, wherein the heat receiver further includes a plurality of valves including the first and second valves and a plurality of cross section areas including the first and second cross section areas, each of the plurality of valves is associated with a respective cross section area of the plurality of cross section areas, and
    wherein the control unit increases an output of a pump causing an increased amount of the refrigerant to flow through the flow path, depending on a number of the plurality of valves reducing a total cross section area of the respective cross sectional areas.

6. A heat receiving apparatus comprising:
    a heat receiver including:
    a case that is provided with a flow path through an inside of the case and through which a refrigerant flows, and that conducts heat from a heat-generating part arranged outside the case; and
    a valve that changes a cross section area of part of the flow path in a state where the refrigerant flows through the flow path;
    a temperature sensor that detects a temperature of the heat-generating part; and
    a control unit that controls the valve to reduce the cross sectional area, when an output value of the temperature sensor is more than a predetermined threshold value,
    wherein the control unit increases an output of a pump that causes an increased amount of the refrigerant to flow through the flow path, when the valve reduces the cross section area.

* * * * *